(12) United States Patent
Dillon et al.

(10) Patent No.: US 6,556,060 B1
(45) Date of Patent: Apr. 29, 2003

(54) LATCH STRUCTURES AND SYSTEMS WITH ENHANCED SPEED AND REDUCED CURRENT DRAIN

(75) Inventors: Christopher Daniel Dillon, Greensboro, NC (US); Lawrence A. Singer, Bedford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/166,220

(22) Filed: Jun. 6, 2002

(51) Int. Cl.[7] ............................................. H03K 3/356
(52) U.S. Cl. ....................................... 327/210; 327/215
(58) Field of Search ............................. 327/51, 52, 55, 327/56, 57, 199, 207, 208, 210, 214, 215, 218, 219

(56) References Cited

U.S. PATENT DOCUMENTS

| | | |
|---|---|---|
| 5,625,308 A | 4/1997 | Matsumoto et al. |
| 5,801,565 A | 9/1998 | Kuo |
| 5,808,514 A | 9/1998 | Kolluri |
| 5,825,256 A | 10/1998 | Tchamov et al. |
| 6,147,514 A * | 11/2000 | Shiratake ........................ 327/55 |
| 6,278,308 B1 * | 8/2001 | Partovi et al. ................. 327/218 |
| 6,344,761 B2 * | 2/2002 | Nishimura et al. ............. 327/55 |
| 6,404,229 B1 * | 6/2002 | Barnes ............................. 326/68 |
| 6,472,920 B1 * | 10/2002 | Cho et al. ...................... 327/215 |

OTHER PUBLICATIONS

Thomas Byunghak Cho, et al., "A 10b, 20Msamples, 35 mW Pipeline A/D Converter", IEEE Jornal of Solid–State Circuits, vol. 30, No. 3, Mar. 1993.

Andrea Boni, et al., "A 2.5–v BiCMOS Comparator with Current–Mode Interpolation" IEEE Jornal of Solid–State Circuits, vol. 34, No. 6, Jun. 1999.

* cited by examiner

Primary Examiner—My-Trang Nu Ton
(74) Attorney, Agent, or Firm—Koppel, Jacobs, Patrick & Heybl

(57) ABSTRACT

Latch structures and systems are disclosed that enhance latch speed and reduce latch current drain while providing complementary metal-oxide-semiconductor (CMOS)-level latch signals. They are realized with bipolar junction structures and CMOS structures that are arranged to limit latch currents in response to CMOS-level sense signals $S_{sns}$.

24 Claims, 3 Drawing Sheets

LATCH STRUCTURES AND SYSTEMS WITH ENHANCED SPEED AND REDUCED CURRENT DRAIN

BACKGROUND OF THE INVENTION

1. Field of the Invention

The present invention relates generally to electronic latches.

2. Description of the Related Art

A variety of modern signal-conditioning systems require electronic latches which can be latched to indicate the state of a fluctuating input signal at a selected latch time. Because these systems often process complementary metal-oxide-semiconductor (CMOS) signals and generally include a significant number of latches which operate at high speeds, there is a continuing search for latch structures that provide CMOS-level latch signals but enhance latch speed and reduce current drain.

BRIEF SUMMARY OF THE INVENTION

The present invention is directed to latch structures and systems that realize enhanced latch speed and reduced latch current drain while providing CMOS-level latch signals. These goals are realized with bipolar junction structures and CMOS structures that are arranged to limit latch currents in response to CMOS-level sense signals $S_{sns}$.

The novel features of the invention are set forth with particularity in the appended claims. The invention will be best understood from the following description when read in conjunction with the accompanying drawings.

DETAILED DESCRIPTION OF THE INVENTION

Figure 1:
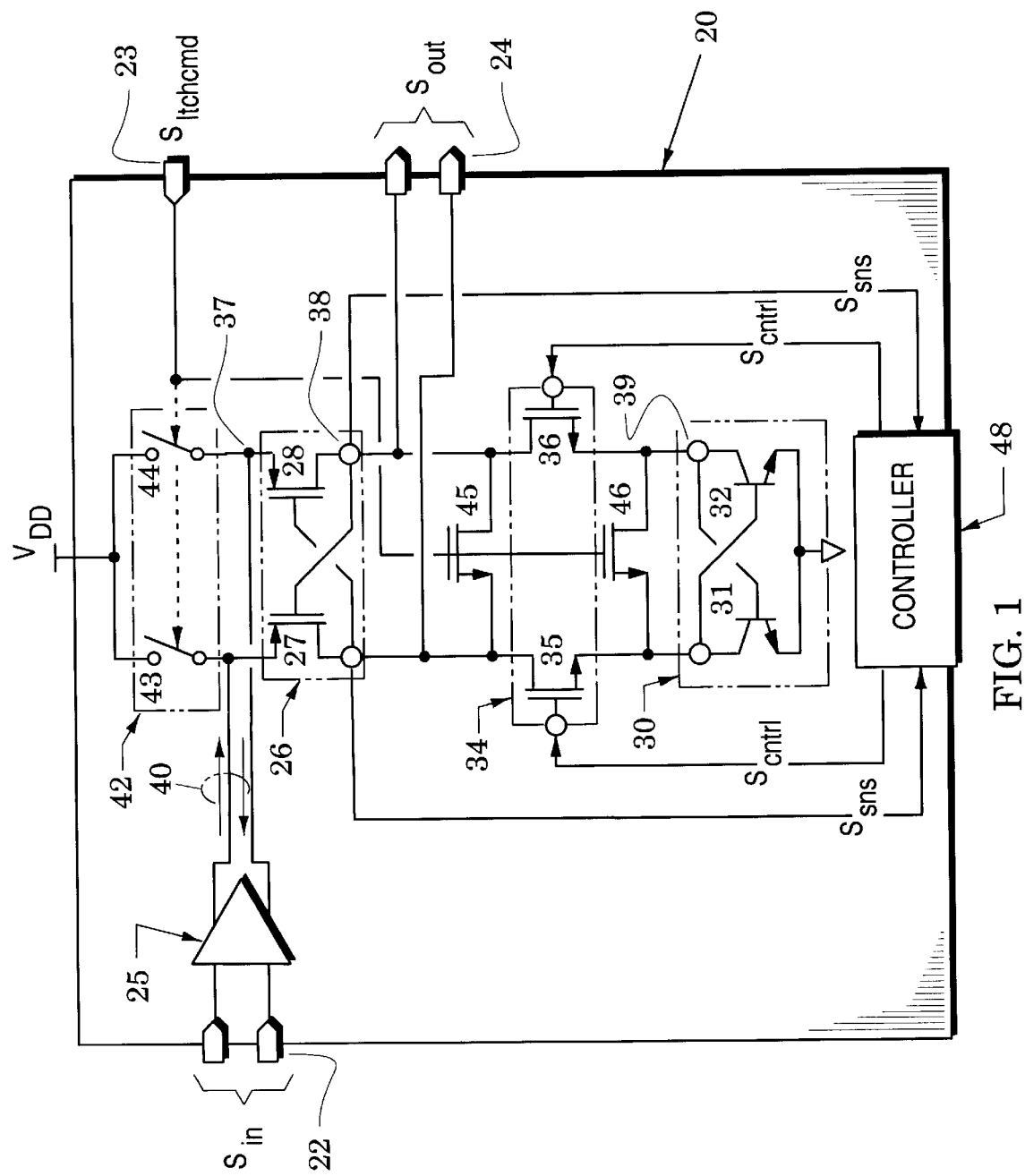
FIG. 1 is a schematic diagram of a latch embodiment of the present invention.

FIG. 1 illustrates a latch embodiment 20 that receives a differential input signal $S_{in}$ at a differential input port 22. The latch tracks the input signal during an acquire mode and transitions from the acquire mode to a latch mode in response to a latch command signal $S_{ltchcmd}$ at a command port 23. During the latch mode, the latch provides, at a differential output port 24, a differential output signal $S_{out}$ which corresponds to the state of the input signal $S_{in}$ at the time that the latch command signal $S_{ltchcmd}$ was initiated. The latch's structure obtains a number of significant advantages which are indicated in the following description.

In particular, the latch 20 includes a differential amplifier 25, a cross-coupled pair 26 of first and second isolation transistors 27 and 28, a cross-coupled pair 30 of first and second latch transistors 31 and 32 and a pair 34 of first and second current-limiting transistors 35 and 36. The isolation transistors 27 and 28 have first current terminals (e.g., sources) 37 and second current terminals 38 (e.g., drains), the latch transistors 31 and 32 provide collectors 39 and the current-limiting transistors 35 and 36 are each coupled between a respective one of the second current terminals 38 and a respective one of the collectors 39. The differential amplifier 25 is coupled between the differential input port 22 and the first current terminals 37 and provides a differential signal, e.g., a differential current 40, in response to the input signal $S_{in}$.

The latch 20 also includes a pair 42 of first and second switches 43 and 44 (realized, for example, with metal-oxide-semiconductor (MOS) transistors) and preferably includes at least one of first and second shorting transistors 45 and 46 that are all responsive to the latch command signal $S_{ltchcmd}$ at the command port 23. The first and second switches 43 and 44 are coupled to the first current terminals 37, the first shorting transistor 45 is coupled between the second current terminals 38 and the second shorting transistor 46 is coupled between the collectors 39.

The latch 20 further includes a controller 48 that receives sense signals $S_{sns}$ from at least one of the second current terminals 38 and, in response, provides control signals $S_{cntrl}$ to the current-limiting transistors 35 and 36. In response to either of the control signals $S_{cntrl}$, the impedance of a corresponding current-limiting transistor 35 or 36 increases from a low acquire impedance to a greater latch impedance.

In an operational acquire mode, the current-limiting transistors 35 and 36 each present their low acquire impedance and the latch command signal $S_{ltchcmd}$ is in a state that turns off the first and second switches 43 and 44 and causes the shorting transistors 45 and 46 to present a low shorting impedances respectively between the second current terminals 38 and between the collectors 39.

The cross-coupling of the isolation transistors 27 and 28 and the latch transistors 31 and 32 provides positive feedback which will urge the latch transistors into one of two stable states in response to the differential current 40 (latch transistor 31 is on and latch transistor 32 is off in a first state and latch transistor 31 is off and latch transistor 32 is on in a second state). In the acquire mode, however, the low shorting impedances of the shorting transistors 45 and 46 substantially eliminates feedback signals and the latch transistors 31 and 32 are thus restrained from moving to either of their stable states. In addition, the first and second switches 43 and 44 do not supply currents that would support either stable state.

The latch operational mode is initiated when the latch command signal $S_{ltchcmd}$ changes to a state that turns on the first and second switches 43 and 44 and causes the shorting transistors 45 and 46 to transition from their low shorting impedances to greater isolating impedances. Accordingly, the cross-coupled feedback process of the latch is enabled and it rapidly urges the latch into the stable state that is indicated by the differential current 40 at the time when the latch command signal $S_{ltchcmd}$ was initiated.

In the indicated latch state, one of the latch transistors 31 and 32 is on and the other is off and one of the isolation transistors 27 and 28 is on and one is off. Although the corresponding difference signal (in the latch state) between the collectors 39 is a low-level signal (e.g., on the order of 0.5 volts), the difference signal between the second current terminals 38 is substantially a rail-to-rail signal (e.g, having a magnitude substantially equal to the difference between $V_{DD}$ and ground). That is, the sense signal $S_{sns}$ between the second current terminals 38 is a CMOS-level signal which is provided at the differential output port 24 as the output signal $S_{out}$.

The controller 48 is configured to respond to these CMOS sense signals $S_{sns}$ and, in response, provide at least an appropriate one of the control signals $S_{cntrl}$ to the current-limiting transistor (35 or 36) that is in the base path of the latch transistor (31 or 32) which is on in the indicated latch state. The amplitude of the control signal $S_{cntrl}$ is selected so that the latch impedance of the current-limiting transistor limits the saturation of the "on" latch transistor.

That is, the indicated stable state is supported by a base current that is drawn from a corresponding one of the first and second switches 43 and 44 but this base current of the "on" latch transistor is limited so that it is sufficient to maintain the corresponding collector substantially at the lower rail but prevents the latch transistor from going into hard saturation. The latched collector current of this transistor is substantially zero because its corresponding one of the isolation transistors 27 and 28 is off in this latch state.

As with any electronic structure, parasitic capacitances are inevitably associated with the output signal port 24 and, accordingly, the regenerative time constant of the latch 20 is proportional to this parasitic capacitance divided by the transconductance of the latch transistors 31 and 32. Because the transconductance of bipolar junction transistors is proportional to their collector current, they generally provide a substantially lower time constant than other transistors.

Accordingly, latch structures of the present invention realize a number of important latch features. First, they provide CMOS-level output signals $S_{out}$ which are desired by a variety of CMOS systems yet their latch speed is enhanced because cross-coupled bipolar junction latch transistors drive the latch's regenerative feedback. All other transistors are low-current CMOS transistors to thereby reduce the latch's current drain. The current drain is further decreased because the current drawn from the switch (43 and 44) that corresponds to an "off" isolation transistor (27 or 28) drops to substantially zero and the base current to the "on" latch transistor is limited to keep it out of hard saturation. The latch's recovery time from the latch mode is improved, and current drawn from the supply (during, the latch mode) is greatly reduced.

The latch's speed is also enhanced because the controller 48 does not apply the appropriate control signal $S_{cntrl}$ until the sense signal $S_{sns}$ has substantially changed its CMOS-level state. Thus, full base currents are supplied to the latch transistors 31 and 32 until they are urged into one of their stable states. Subsequently, the impedance of the corresponding current-limiting transistor (35 or 36) transitions to its greater latch impedance in response to the CMOS-level sense signals $S_{sns}$ and thus limits saturation in the "on" latch transistor. In contrast, the latching process would be slowed if the sense signals $S_{sns}$ were taken from the collectors 39 because a corresponding one of the current-limiting transistors 35 and 36 would begin to limit base current before the latching process was complete.

Figure 2:
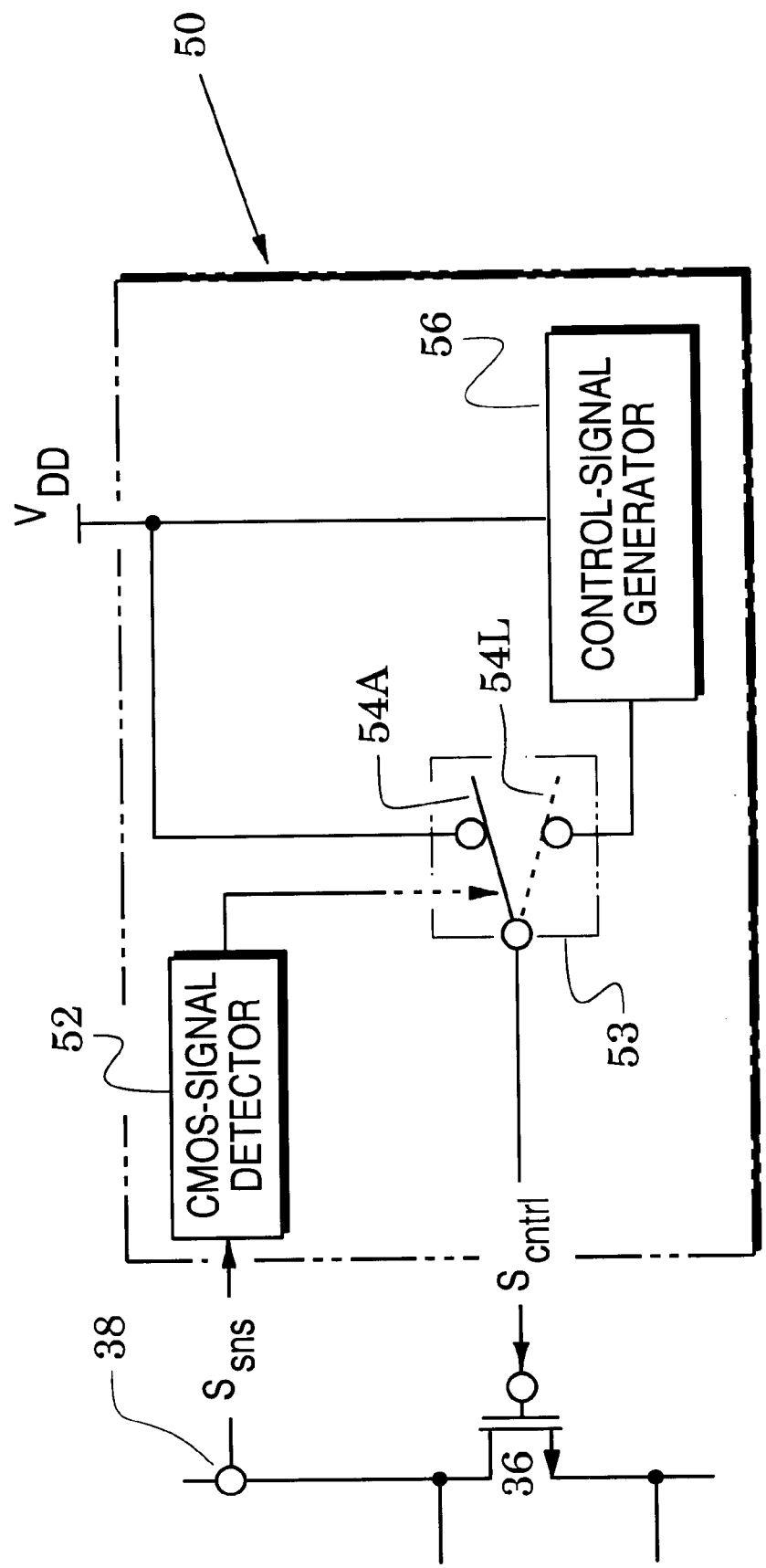
FIG. 2 is a schematic diagram of a controller embodiment in the latch of FIG. 1.

FIG. 2 illustrates an embodiment 50 of structure within the controller 48 of FIG. 1. In this embodiment, the controller includes a detector 52 that senses CMOS-level sense signals $S_{sns}$ at the second current terminal 38 (also shown in FIG. 1) and, in response, moves a switch 53 from an acquire position 54A to a latch position 54L. The embodiment also includes a generator 56 that provides a respective level of the control signal $S_{cntrl}$.

In the acquire position 54A, the control signal $S_{cntrl}$ is $V_{DD}$ which places the corresponding current-limiting transistor 36 in its low acquire impedance. In the latch position 54L, the control signal $S_{cntrl}$ from the generator 56 is applied and the impedance of the current-limiting transistor 36 transitions from its low acquire impedance to its greater latch impedance. The control signal from the generator 56 is selected so that the latch impedance will limit the saturation of the corresponding "on" latch transistor (31 or 32 in FIG. 1).

The detector 52, switch 53 and generator 56 are preferably realized with various conventional CMOS structures (e.g., CMOS inverters and transmission gates) to further limit current drain of latch embodiments of the invention. Although the controller embodiment 50 controls the current-limiting transistor 36 in response to sense signals $S_{sns}$ at the second current terminal 38 that couples to that transistor, it is important to note that the controller embodiment 50 can also be structured to control this current-limiting transistor in response to the opposite one of the second current terminals because one current terminal's state is simply opposite that of the other.

Figure 3:
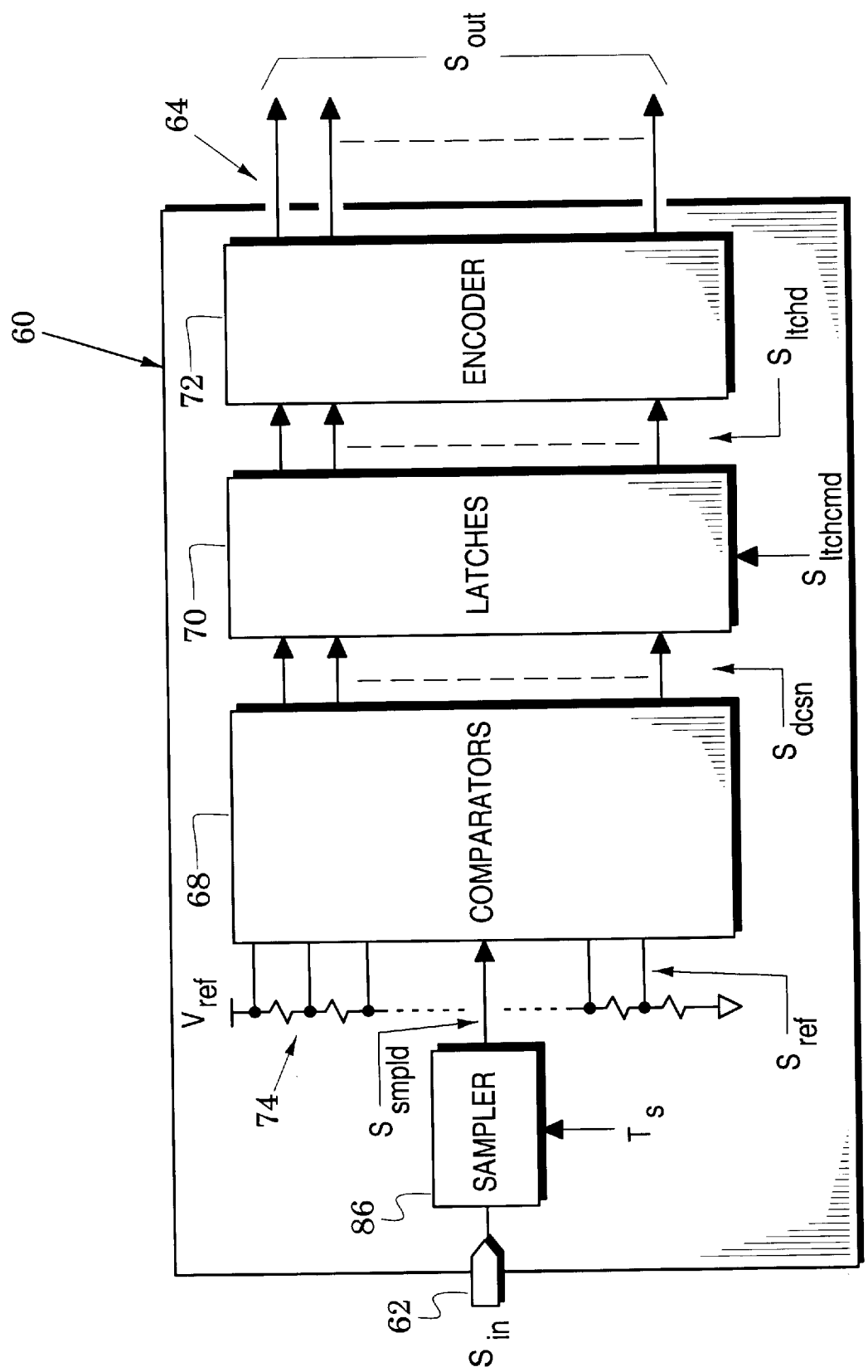
FIG. 3 is block diagram of an analog-to-digital converter that includes the latch of FIG. 1.

The reduced current drain of latch embodiments of the invention is especially important in systems that employ a significant number of latches. For example, FIG. 3 illustrates a flash analog-to-digital converter (ADC) 60 which converts an analog input signal $S_{in}$ at an input port 62 to a digital output signal $S_{out}$ at an output port 64. The ADC 60 includes a sampler 66, comparators 68, latches 70 and encoders 72.

A resistive ladder 74 provides reference signals $S_{ref}$ and, in response to the input signal $S_{in}$ (which may be a differential signal) and timing signals $T_s$, the sampler 66 provides sample signals $S_{smpl}$. The comparators compare each sample signal to the reference signals and provide decision signals $S_{dcsn}$ that define the state of the sample relative to the reference signals.

In response to a latch command signal $S_{ltchcmd}$ (also shown at command port 23 in FIG. 1), the latches 70 provide latched output signals $S_{ltchd}$ which correspond to the state of the decision signals $S_{dcsn}$ at the time of the latch command signal $S_{ltchcmd}$. The latched output signals $S_{ltchd}$ are then converted to various digital output signal formats, e.g., an N-bit binary output or a Gray-code binary output).

Although latch embodiments of the invention essentially perform a sampling process, the flash ADC 60 preferably includes the sampler 66 so that the comparators 68 can process a held signal rather than a changing signal. Because the ADC 60 may contain a substantial number of latches, its current drain can be significantly reduced by use of the latch embodiments of the invention.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. In a latch that transitions from an acquire mode to a latch mode in response to a latch command signal and has cross-coupled first and second isolation transistors that have first and second current terminals with said first current terminals coupled to receive a differential input signal, cross-coupled first and second latch transistors that provide collectors, and first and second current-limiting transistors that are each coupled between a respective one of said second current terminals and a respective one of said collectors and that each provide an impedance that transitions from an acquire impedance to a greater latch impedance in response to a respective one of control signals $S_{cntrl}$; the improvement comprising:

at least one switch coupled to provide currents to said first current terminals in response to said latch command signal;

and a controller that responds to complementary metal-oxide-semiconductor (CMOS) signals and is coupled to receive CMOS-level sense signals $S_{sns}$ from at least one of said second current terminals and, in response, provide at least one of said control signals $S_{cntrl}$.

2. The latch of claim 1, further including at least one of first and second shorting transistors that are respectively coupled between said second current terminals and between said collectors and that each transition from a shorting impedance to a greater isolating impedance in response to said latch command signal.

3. The latch of claim 2, wherein said isolation transistors, said current-limiting transistors and said shorting transistors are metal-oxide-semiconductor transistors.

4. The latch of claim 1, wherein said controller includes:
a control-signal generator that provides said control signal $S_{cntrl}$ which corresponds to a latch impedance in either of said current-limiting transistors that limits saturation in a
respective one of said latch transistors; and a detector that causes said control signal $S_{cntrl}$ to be coupled to a
respective one of said current-limiting transistors in response to said CMOS-level sense signals $S_{sns}$ from a respective one of said second current terminals.

5. The latch of claim 1, wherein said latch transistors are bipolar junction transistors.

6. The latch of claim 1, wherein said switch is a metal-oxide-semiconductor transistor.

7. In a latch that transitions from an acquire mode to a latch mode in response to a latch command signal and has cross-coupled first and second isolation transistors that have first and second current terminals with said first current terminals coupled to receive a differential input signal, cross-coupled first and second latch transistors that provide collectors, and first and second current-limiting transistors that are each coupled between a respective one of said second current terminals and a respective one of said collectors and that each provide an impedance that transitions from an acquire impedance to a greater latch impedance in response to a respective one of control signals $S_{cntrl}$; the improvement comprising:
at least one of first and second shorting transistors that are respectively coupled between said second current terminals and between said collectors and that each transition from a shorting impedance to a greater isolating impedance in response to said latch command signal; and
a controller that responds to complementary metal-oxide-semiconductor (CMOS) signals and is coupled to receive CMOS-level sense signals $S_{sns}$ from at least one of said second current terminals and, in response, provide at least one of said control signals $S_{cntrl}$.

8. The latch of claim 7, further including at least one switch coupled to provide currents to said first current terminals in response to said latch command signal.

9. The latch of claim 8, wherein said switch is a metal-oxide-semiconductor transistor.

10. The latch of claim 7, wherein said isolation transistors, said current-limiting transistors and said shorting transistors are metal-oxide-semiconductor transistors.

11. The latch of claim 7, wherein said controller includes:
a control-signal generator that provides said signal $S_{cntrl}$ which corresponds to a latch impedance in either of said current-limiting transistors that limits saturation in a respective one of said latch transistors; and
a detector that causes said control signal $S_{cntrl}$ to be coupled to a respective one of said current-limiting transistors in response to said CMOS-level sense signals $S_{sns}$ from a respective one of said second current terminals.

12. The latch of claim 7, wherein said latch transistors are bipolar junction transistors.

13. In an analog-to-digital converter that converts an analog input signal to a corresponding digital output signal in response to a latch command signal and has cross-coupled first and second isolation transistors that have first and second current terminals with said first current terminals coupled to receive a differential input signal, cross-coupled first and second latch transistors that provide collectors, and first and second current-limiting transistors that are each coupled between a respective one of said second current terminals and a respective one of said collectors and that each provide an impedance that transitions from an acquire impedance to a greater latch impedance in response to a respective one of control signals $S_{cntrl}$; the improvement comprising:
a sampler that provides a sample of said analog input signal;
a resistor ladder that provides a plurality of reference signals;
comparators that generate comparison signals in response to said sample and said reference signals;
latches that provide latched output signals in response to said comparison signals and said latch command signal; and
an encoder that generates said digital output signal in response to said latched output signals;
wherein each of said latches transitions from an acquire mode to a latch mode in response to said latch command signal and includes:
a) at least one switch coupled to provide currents to said first current terminals in response to said latch command signal; and
b) a controller that responds to complementary metal-oxide-semiconductor (CMOS) signals and is coupled to receive CMOS-level sense signals $S_{sns}$ from at least one of said second current terminals and, in response, provide at least one of said control signals $S_{cntrl}$.

14. The converter of claim 13, further including at least one of first and second shorting transistors that are respectively coupled between said second current terminals and between said collectors and that each transition from a shorting impedance to a greater isolating impedance in response to said latch command signal.

15. The converter of claim 14, wherein said isolation transistors, said current-limiting transistors and said shorting transistors are metal-oxide-semiconductor transistors.

16. The converter of claim 13, wherein said controller includes:
a control-signal generator that provides said control signal $S_{cntrl}$ which corresponds to a latch impedance in either of said current-limiting transistors that limits saturation in a respective one of said latch transistors; and
a detector that causes said control signal $S_{cntrl}$ to be coupled to a respective one of said current-limiting transistors in response to said CMOS-level sense signals $S_{sns}$ from a respective one of said second current terminals.

17. The converter of claim 13, wherein said latch transistors are bipolar junction transistors.

18. The converter of claim 13, wherein said switch is a metal-oxide-semiconductor transistor.

19. In an analog-to-digital converter that converts an analog input signal to a corresponding digital output signal in response to a latch command signal and has cross-coupled first and second isolation transistors that have first and second current terminals with said first current terminals coupled to receive a differential input signal, cross-coupled first and second latch transistors that provide collectors, and first and second current-limiting transistors that are each coupled between a respective one of said second current terminals and a respective one of said collectors and that each provide an impedance that transitions from an acquire impedance to a greater latch impedance in response to a respective one of control signals $S_{cntrl}$; the improvement comprising:

a sampler that provides a sample of said analog input signal;

a resistor ladder that provides a plurality of reference signals;

comparators that generate comparison signals in response to said sample and said reference signals;

latches that provide latched output signals in response to said comparison signals and said latch command signal; and an encoder that generates said digital output signal in response to said latched output signals;

wherein each of said latches transitions from an acquire mode to a latch mode in response to said latch command signal and includes:

a) at least one of first and second shorting transistors that are respectively coupled between said second current terminals and between said collectors and that each transition from a shorting impedance to a greater isolating impedance in response to said latch command signal; and b) a controller that responds to complementary metal-oxide-semiconductor (CMOS) signals and is coupled to receive CMOS-level sense signals $S_{sns}$ from at least one of said second current terminals and, in response, provide at least one of said control signals $S_{cntrl}$.

20. The converter of claim 19, further including at least one switch coupled to provide currents to said first current terminals in response to said latch command signal.

21. The converter of claim 20, wherein said switch is a metal-oxide-semiconductor transistor.

22. The converter of claim 19, wherein said isolation transistors, said current-limiting transistors and said shorting transistors are metal-oxide-semiconductor transistors.

23. The converter of claim 19, wherein said controller includes:

a control-signal generator that provides said control signal $S_{cntrl}$ which corresponds to a latch impedance in either of said current-limiting transistors that limits saturation in a respective one of said latch transistors; and a detector that causes said control signal $S_{cntrl}$ to be coupled to a respective one of said current-limiting transistors in response to said CMOS-level sense signals $S_{sns}$ from a respective one of said second current terminals.

24. The converter of claim 19, wherein said latch transistors are bipolar junction transistors.

* * * * *